US009289851B2

(12) United States Patent
Morikazu

(10) Patent No.: US 9,289,851 B2
(45) Date of Patent: Mar. 22, 2016

(54) LASER PROCESSING METHOD

(71) Applicant: Disco Corporation, Tokyo (JP)

(72) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 442 days.

(21) Appl. No.: 13/937,924

(22) Filed: Jul. 9, 2013

(65) Prior Publication Data

US 2014/0014631 A1 Jan. 16, 2014

(30) Foreign Application Priority Data

Jul. 10, 2012 (JP) ................................ 2012-154803

(51) Int. Cl.

| | |
|---|---|
| ***B23K 26/359*** | (2014.01) |
| ***B23K 26/364*** | (2014.01) |
| ***H01L 21/301*** | (2006.01) |
| ***B23K 26/02*** | (2014.01) |
| ***H01L 21/30*** | (2006.01) |
| ***B23K 26/067*** | (2006.01) |
| ***B23K 26/08*** | (2014.01) |

(52) U.S. Cl.

CPC ............... *B23K 26/02* (2013.01); *B23K 26/042* (2015.10); *B23K 26/0624* (2015.10); *B23K 26/0673* (2013.01); *B23K 26/0853* (2013.01); *B23K 26/0869* (2013.01); *B23K 26/359* (2015.10); *B23K 26/364* (2015.10); *H01L 21/30* (2013.01)

(58) Field of Classification Search

CPC ..... H01L 21/301; H01L 21/78; H01L 41/338; B23K 26/00; B23K 26/359; B23K 26/364; B23K 101/40

USPC ............ 219/121.67–121.69, 121.72, 121.61, 219/121.62; 438/33, 113

See application file for complete search history.

(56) References Cited

U.S. PATENT DOCUMENTS

| | | | | |
|---|---|---|---|---|
| 5,656,186 A * | 8/1997 | Mourou | A61B 18/20 | 219/121.69 |
| 5,998,759 A * | 12/1999 | Smart | B23K 26/0853 | 219/121.61 |
| 6,333,485 B1 * | 12/2001 | Haight | A61B 18/26 | 219/121.68 |
| 2011/0287607 A1 * | 11/2011 | Osako | B23K 26/0608 | 438/462 |

FOREIGN PATENT DOCUMENTS

| | | |
|---|---|---|
| JP | 2005-353935 | 12/2005 |

* cited by examiner

*Primary Examiner* — Samuel M Heinrich

(74) *Attorney, Agent, or Firm* — Greer Burns & Crain, Ltd.

(57) ABSTRACT

A laser processing method of applying a pulsed laser beam having a repetition frequency of 20 kHz or more to a workpiece to thereby process the workpiece. The relation between the wavelength of the pulsed laser beam and the pulse width generating no cracks is determined by experiment on the basis of the absorption edge of the workpiece, thereby setting the processing conditions. The relation between various set values for the wavelength and the limits of the pulse width is plotted to prepare a graph having a vertical axis representing the wavelength and a horizontal axis representing the pulse width. The pulsed laser beam is applied in the region below a curve obtained by connecting the limits of the pulse width at the various set values for the wavelength.

1 Claim, 7 Drawing Sheets

WAVELENGTH
(nm)
1600
1400
1200
1000
800
600
400
200
0
PULSE WIDTH
1fs
10fs
100fs
1ps
10ps
100ps
1ns
10ns
100ns
1μs
Si
SiC
LT
Al2O3

LASER PROCESSING METHOD

BACKGROUND OF THE INVENTION

1. Field of the Invention

The present invention relates to a laser processing method of applying a pulsed laser beam to a workpiece to thereby process the workpiece.

2. Description of the Related Art

In a semiconductor device fabrication process, a plurality of crossing division lines called streets are formed on the front side of a substantially disk-shaped silicon substrate to thereby partition a plurality of regions where a plurality of circuits such as ICs and LSIs are respectively formed, thus preparing a semiconductor wafer having the plural circuits on the front side. The semiconductor wafer is cut along the streets to thereby divide the regions where the circuits are formed from each other, thus obtaining individual semiconductor devices. Further, an optical device wafer is prepared by forming a layer of gallium nitride base compound semiconductor or the like on the front side of a sapphire substrate, silicon carbide substrate, lithium tantalate substrate, or lithium niobate substrate. The optical device wafer is also cut along the streets to obtain individual optical devices divided from each other, such as light emitting diodes and laser diodes. These optical devices are widely used in electrical equipment.

As a method of dividing a wafer such as a semiconductor wafer along the streets, there has recently been proposed a method including the steps of applying a pulsed laser beam having an absorption wavelength (e.g., 532 nm, 355 nm, or 266 nm) to the wafer along the streets to thereby form a laser processed groove on the wafer along each street by ablation and next breaking the wafer along each laser processed groove (see Japanese Patent Laid-open No. 2005-353935, for example).

SUMMARY OF THE INVENTION

In applying the pulsed laser beam to the wafer to form the laser processed groove on the wafer along each street by ablation, the productivity can be improved by increasing the repetition frequency of the pulsed laser beam. However, when the repetition frequency of the pulsed laser beam is set to 20 kHz or more, there is a problem that cracks may be generated due to the accumulation of heat, causing a reduction in device quality.

Further, in performing the ablation, the use of the pulsed laser beam having an absorption wavelength to the workpiece is desirable for the improvement in processing efficiency. It is more desirable to use a pulsed laser beam having a wavelength shorter than the wavelength near the absorption edge of the workpiece. However, in the case that the workpiece is formed of a material having a short absorption edge of 155 nm, such as sapphire, there is a problem that it is difficult to use the pulsed laser beam having a wavelength shorter than the wavelength near the absorption edge of the workpiece.

It is therefore an object of the present invention to provide a laser processing method which can prevent the generation of cracks even when the repetition frequency of a pulsed laser beam to be applied is set to 20 kHz or more. It is another object of the present invention to provide a laser processing method which can perform the ablation even when the wavelength of the pulsed laser beam is longer than the absorption edge of the material forming the workpiece.

In accordance with an aspect of the present invention, there is provided a laser processing method of applying a pulsed laser beam having a repetition frequency of 20 kHz or more to a workpiece to thereby process the workpiece, the laser processing method including the steps of setting the pulse width of the pulsed laser beam to 10 ps or less in the case that the wavelength of the pulsed laser beam is equal to the absorption edge of the workpiece; setting the pulse width of the pulsed laser beam to 100 ps or less in the case that the wavelength of the pulsed laser beam is equal to 9/10 of the absorption edge of the workpiece; setting the pulse width of the pulsed laser beam to 1 ns or less in the case that the wavelength of the pulsed laser beam is equal to 8/10 of the absorption edge of the workpiece; setting the pulse width of the pulsed laser beam to 10 ns or less in the case that the wavelength of the pulsed laser beam is equal to 7/10 of the absorption edge of the workpiece; setting the pulse width of the pulsed laser beam to 100 ns or less in the case that the wavelength of the pulsed laser beam is equal to 6/10 of the absorption edge of the workpiece; setting the pulse width of the pulsed laser beam to 100 fs or less in the case that the wavelength of the pulsed laser beam is equal to a value two times the absorption edge of the workpiece; and setting the pulse width of the pulsed laser beam to 10 fs or less in the case that the wavelength of the pulsed laser beam is equal to a value four times the absorption edge of the workpiece; wherein the relation between the various set values for the wavelength of the pulsed laser beam and the various set values for the pulse width of the pulsed laser beam is plotted to prepare a graph having a vertical axis representing the wavelength and a horizontal axis representing the pulse width, and the pulsed laser beam is applied in the region below a curve obtained by connecting the limits of the pulse width at the various set values for the wavelength.

According to the laser processing method of the present invention, a pulsed laser beam having a repetition frequency of 20 kHz or more is applied to a workpiece to thereby ablate the workpiece. In performing such ablation, the relation between the wavelength and pulse width of the pulsed laser beam generating no cracks is determined by experiment on the basis of the absorption edge of the material of the workpiece, thereby setting the processing conditions. Accordingly, even when the repetition frequency is set to 20 kHz or more, the accumulation of heat can be suppressed to thereby prevent the generation of cracks in laser processing, so that the workpiece can be ablated with high processing efficiency.

Further, even when the workpiece is formed of a material having a relatively short absorption edge of 155 nm, such as sapphire, the ablation can be performed by using a laser beam having a wavelength longer than the absorption edge.

The above and other objects, features and advantages of the present invention and the manner of realizing them will become more apparent, and the invention itself will best be understood from a study of the following description and appended claims with reference to the attached drawings showing some preferred embodiment of the invention.

DETAILED DESCRIPTION OF THE PREFERRED EMBODIMENT

Figure 1:
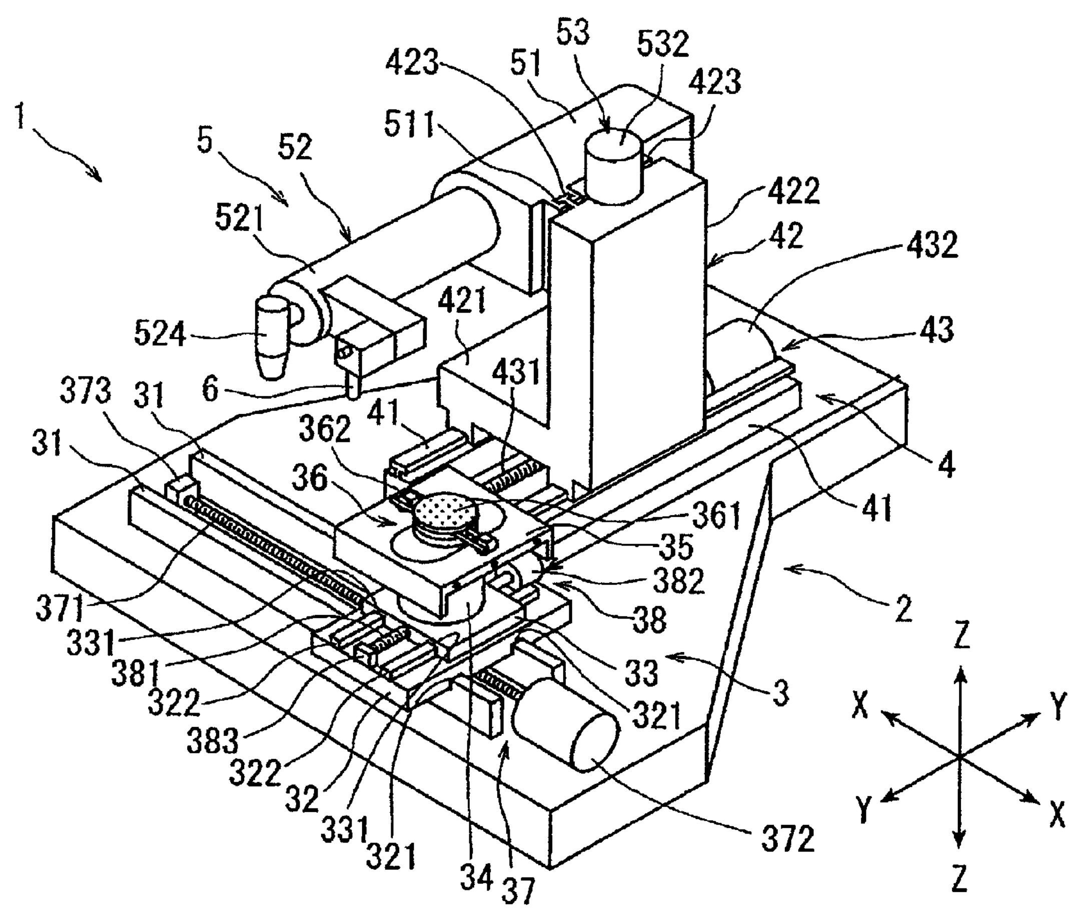
FIG. 1 is a perspective view of a laser processing apparatus for performing the laser processing method according to the present invention.

A preferred embodiment of the laser processing method for a wafer according to the present invention will now be described in detail with reference to the attached drawings. FIG. 1 is a perspective view of a laser processing apparatus 1 for performing the laser processing method according to the present invention. The laser processing apparatus 1 shown in FIG. 1 includes a stationary base 2, a chuck table mechanism 3 for holding a workpiece, the chuck table mechanism 3 being provided on the stationary base 2 so as to be movable in a feeding direction (X direction) shown by an arrow X, a laser beam applying unit supporting mechanism 4 provided on the stationary base 2 so as to be movable in an indexing direction (Y direction) shown by an arrow Y perpendicular to the X direction, and a laser beam applying unit 5 provided on the laser beam applying unit supporting mechanism 4 so as to be movable in a focal position adjusting direction (Z direction) shown by an arrow Z.

The chuck table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in the Y direction, a cover table 35 supported by a cylindrical member 34 standing on the second slide block 33, and a chuck table 36 as workpiece holding means. The chuck table 36 has a vacuum chuck 361 formed of a porous material. A workpiece such as a disk-shaped semiconductor wafer is adapted to be held under suction on the vacuum chuck 361 by operating suction means (not shown). The chuck table 36 is rotatable by a pulse motor (not shown) provided in the cylindrical member 34. Further, the chuck table 36 is provided with clamps 362 for fixing an annular frame to be hereinafter described.

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The chuck table mechanism 3 further includes feeding means 37 for moving the first slide block 32 in the X direction along the guide rails 31. The feeding means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 372 to normally or reversely rotate the externally threaded rod 371.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The chuck table mechanism 3 further includes first indexing means 38 for moving the second slide block 33 in the Y direction along the guide rails 322. The first indexing means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 382 to normally or reversely rotate the externally threaded rod 381.

The laser beam applying unit supporting mechanism 4 includes a pair of guide rails 41 provided on the stationary base 2 so as to extend parallel to each other in the Y direction and a movable support base 42 provided on the guide rails 41 so as to be movable in the Y direction. The movable support base 42 is composed of a horizontal portion 421 slidably supported to the guide rails 41 and a vertical portion 422 extending vertically upward from the upper surface of the horizontal portion 421. Further, a pair of guide rails 423 are provided on one side surface of the vertical portion 422 so as to extend parallel to each other in the Z direction. The laser beam applying unit supporting mechanism 4 further includes second indexing means 43 for moving the movable support base 42 in the Y direction along the guide rails 41. The second indexing means 43 includes an externally threaded rod 431 extending parallel to the guide rails 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and is connected at the other end to the output shaft of the pulse motor 432 so as to receive the torque thereof. The externally threaded rod 431 is engaged with a tapped through hole formed in an internally threaded block (not shown) projecting from the lower surface of the horizontal portion 421 at a central portion thereof. Accordingly, the movable support base 42 is moved in the Y direction along the guide rails 41 by operating the pulse motor 432 to normally or reversely rotate the externally threaded rod 431.

The laser beam applying unit 5 includes a unit holder 51 and laser beam applying means 52 mounted to the unit holder 51. The unit holder 51 is formed with a pair of guided grooves 511 for slidably engaging the pair of guide rails 423 provided on the vertical portion 422 of the movable support base 42. Accordingly, the unit holder 51 is supported to the movable support base 42 so as to be movable in the Z direction by the slidable engagement of the guided grooves 511 with the guide rails 423.

The laser beam applying unit 5 further includes focal position adjusting means 53 for moving the unit holder 51 along the guide rails 423 in the Z direction. The focal position adjusting means 53 includes an externally threaded rod (not shown) extending parallel to the guide rails 423 so as to be interposed therebetween and a pulse motor 532 as a drive source for rotationally driving this externally threaded rod. Accordingly, the unit holder 51 and the laser beam applying means 52 are moved in the Z direction along the guide rails 423 by operating the pulse motor 532 to normally or reversely rotate this externally threaded rod. In this preferred embodiment, when the pulse motor 532 is normally operated, the laser beam applying means 52 is moved upward, whereas when the pulse motor 532 is reversely operated, the laser beam applying means 52 is moved downward.

Figure 2:
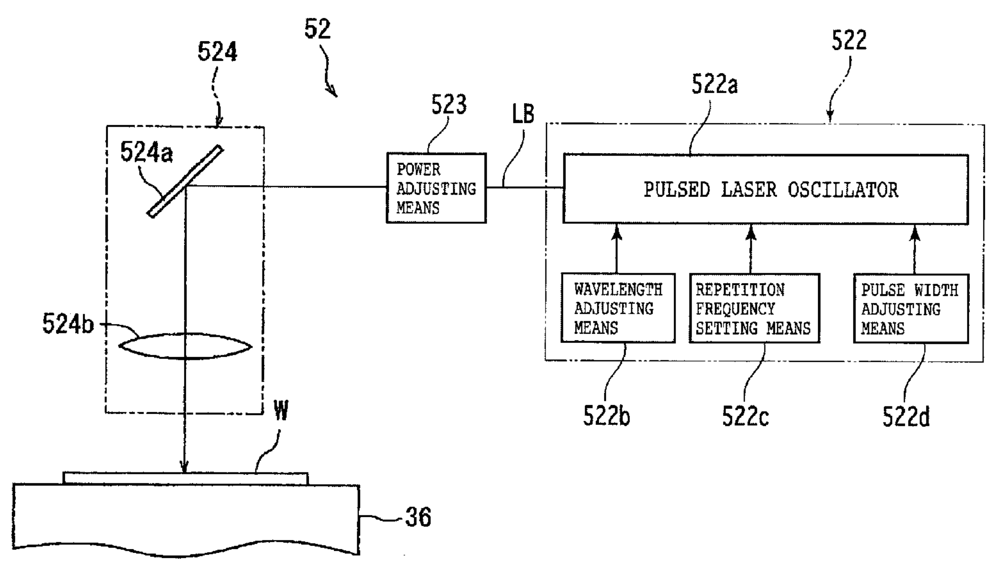
FIG. 2 is a schematic block diagram showing the configuration of laser beam applying means included in the laser processing apparatus shown in FIG. 1.

The laser beam applying means 52 will now be described with reference to FIGS. 1 and 2. The laser beam applying means 52 includes a cylindrical casing 521 fixed to the unit holder 51 so as to extend in a substantially horizontal direction, pulsed laser beam oscillating means 522 provided in the casing 521, power adjusting means 523 for adjusting the power of a pulsed laser beam LB oscillated by the pulsed laser beam oscillating means 522, and focusing means 524 for focusing the pulsed laser beam LB adjusted in power by the power adjusting means 523 and applying this focused beam LB to a workpiece W held on the chuck table 36.

The pulsed laser beam oscillating means 522 is composed of a pulsed laser oscillator 522*a* such as a YAG laser oscillator or a YVO4 laser oscillator, wavelength adjusting means 522*b* for adjusting the wavelength of a pulsed laser beam to be oscillated by the pulsed laser oscillator 522*a*, repetition frequency setting means 522*c* for setting the repetition frequency of the pulsed laser beam to be oscillated by the pulsed laser oscillator 522*a*, and pulse width adjusting means 522*d* for adjusting the pulse width of the pulsed laser beam to be oscillated by the pulsed laser oscillator 522*a*. The power adjusting means 523 functions to adjust the power of the pulsed laser beam LB oscillated by the pulsed laser beam oscillating means 522 to a predetermined power. The pulsed laser oscillator 522*a*, the wavelength adjusting means 522*b*, the repetition frequency setting means 522*c*, and the pulse width adjusting means 522*d* of the pulsed laser beam oscillating means 522 and the power adjusting means 523 are controlled by control means to be hereinafter described.

The focusing means 524 includes a direction changing mirror 524*a* for changing the traveling direction of the pulsed laser beam LB oscillated by the pulsed laser beam oscillating means 522 and adjusted in power by the power adjusting means 523 toward the holding surface of the chuck table 36 and a focusing lens 524*b* for focusing the pulsed laser beam whose traveling direction has been changed by the direction changing mirror 524*a* and applying this focused beam to the workpiece W held on the chuck table 36. As shown in FIG. 1, the focusing means 524 having the above configuration is mounted at the front end of the casing 521.

Referring back to FIG. 1, the laser processing apparatus 1 further includes imaging means 6 provided at the front end portion of the casing 521 constituting the laser beam applying means 52 for imaging to detect a subject area of the workpiece to be laser-processed by the laser beam applying means 52. The imaging means 6 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 6 is transmitted to control means to be described below.

Figure 3:
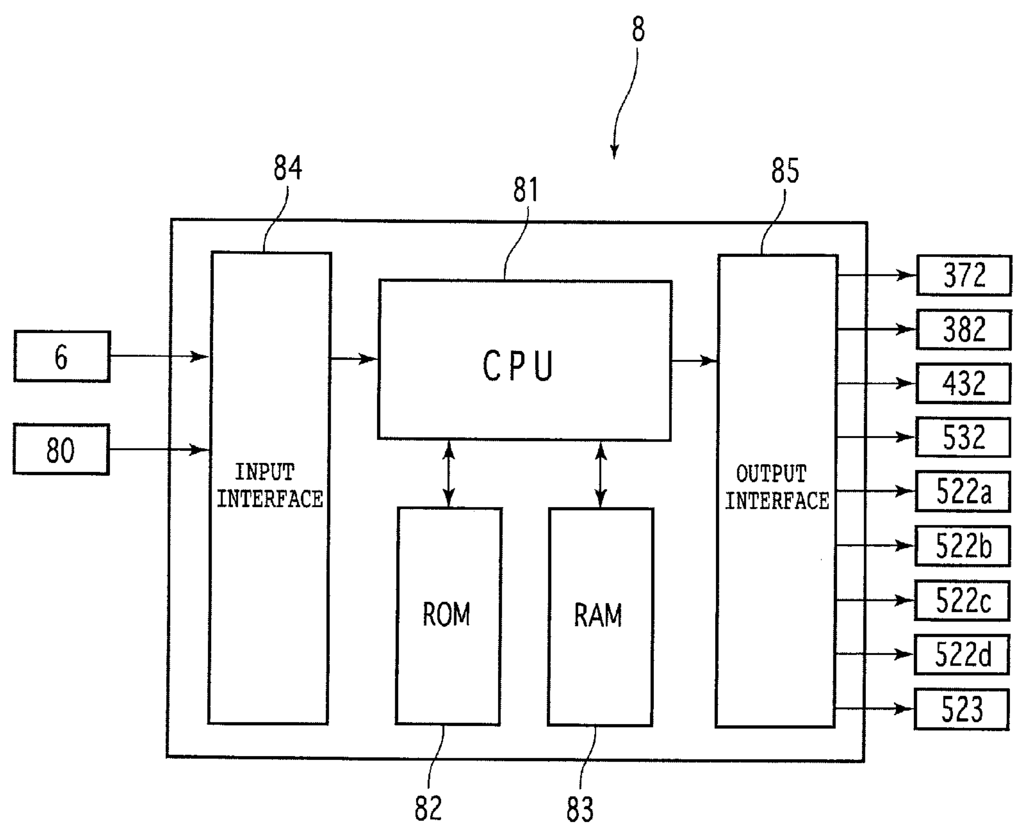
FIG. 3 is a schematic block diagram showing the configuration of control means included in the laser processing apparatus shown in FIG. 1.

The laser processing apparatus 1 includes control means 8 shown in FIG. 3. The control means 8 is configured by a computer, and it includes a central processing unit (CPU) 81 for performing operational processing according to a control program, a read only memory (ROM) 82 preliminarily storing the control program, a readable and writable random access memory (RAM) 83 for storing the results of computation, etc., an input interface 84, and an output interface 85. Detection signals from the imaging means 6 and input means 80 are input into the input interface 84 of the control means 8. On the other hand, control signals are output from the output interface 85 of the control means 8 to the pulse motor 372, the pulse motor 382, the pulse motor 432, the pulse motor 532, the pulsed laser oscillator 522*a*, the wavelength adjusting means 522*b*, the repetition frequency setting means 522*c*, and the pulse width adjusting means 522*d* of the pulsed laser beam oscillating means 522, and the power adjusting means 523.

Figure 4:
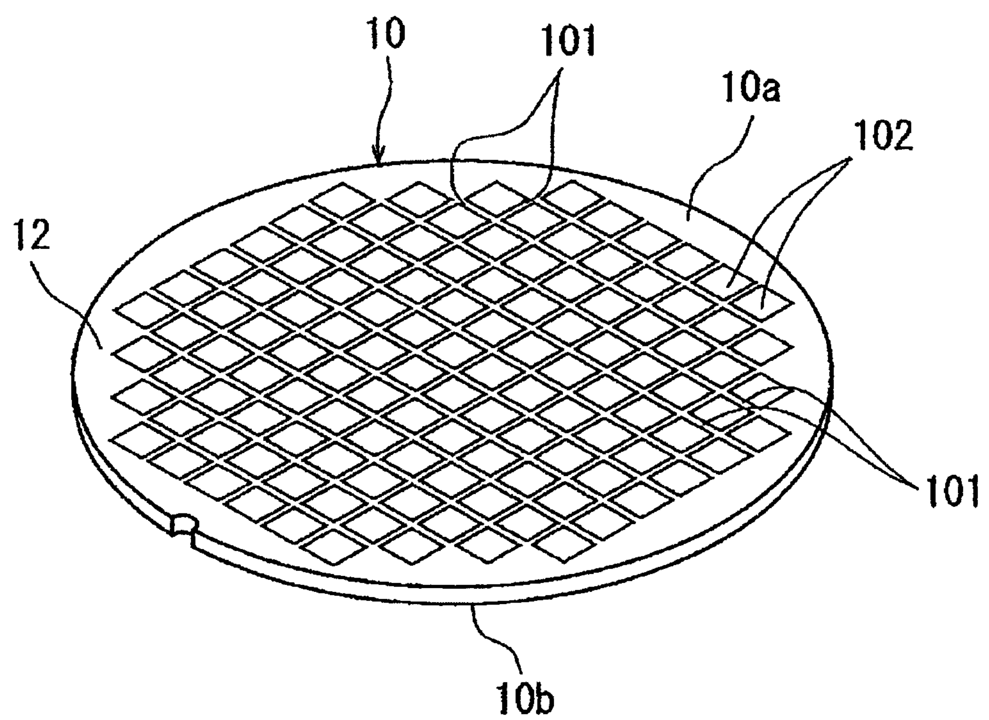
FIG. 4 is a perspective view of a wafer as a workpiece to be processed by the laser processing method according to the present invention.

The operation of the laser processing apparatus 1 configured as above will now be described. FIG. 4 is a perspective view of a wafer 10 as a workpiece to be processed by the laser processing method according to the present invention. The wafer 10 shown in FIG. 4 is formed from a substrate having a thickness of 100 μm, for example. A plurality of crossing streets 101 are formed on a front side 10*a* of the wafer 10, thereby partitioning a plurality of rectangular regions where a plurality of devices 102 are respectively formed. There will now be described a laser processing method of forming a laser processed groove along each street 101 on the wafer 10 by using the laser processing apparatus 1.

Figure 5A:
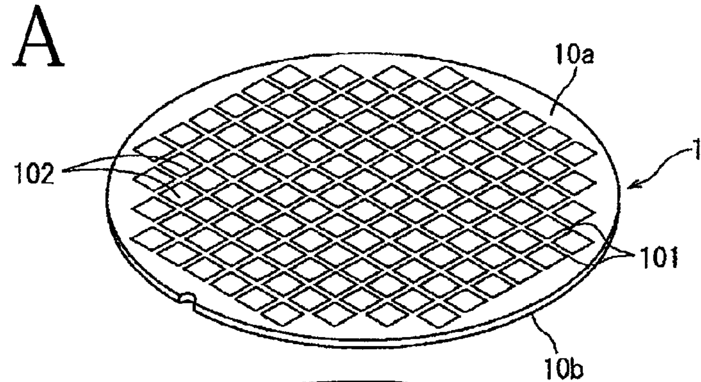
FIG. 5A is an exploded perspective view showing a manner of attaching the wafer shown in FIG. 4 to a dicing tape supported to an annular frame.
Figure 5A:
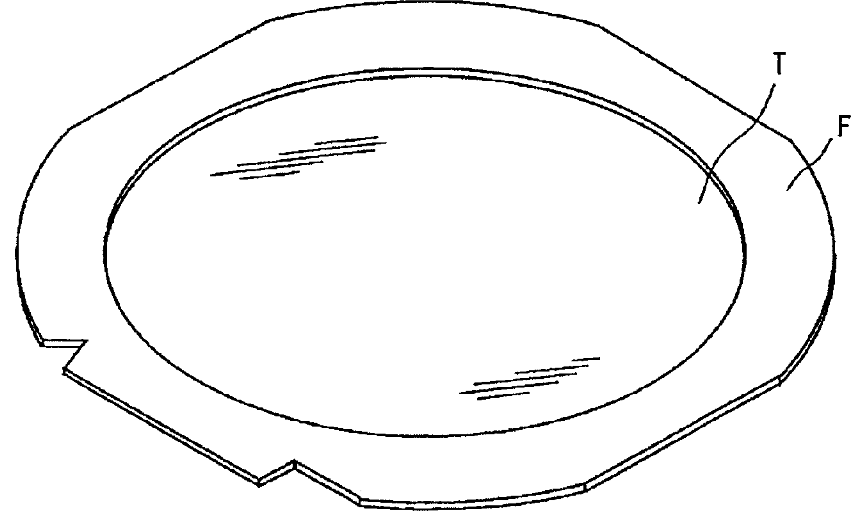
Figure 5B:
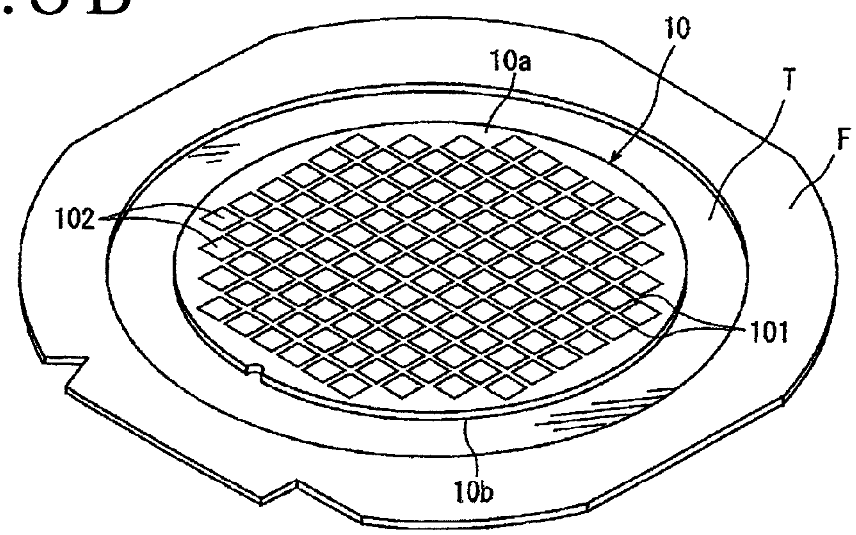
FIG. 5B is a perspective view showing a condition where the wafer is attached to the dicing tape shown in FIG. 5A.

As shown in FIGS. 5A and 5B, the wafer 10 is supported through a dicing tape T to an annular frame F in such a manner that a back side 10*b* of the wafer 10 is attached to the dicing tape T (wafer supporting step). The dicing tape T is preliminarily supported at its outer circumferential portion to the annular frame F so as to close the inside opening of the annular frame F. After performing this wafer supporting step, the wafer 10 supported through the dicing tape T to the annular frame F is placed on the chuck table 36 of the laser processing apparatus 1 shown in FIG. 1 in the condition where the dicing tape T comes into contact with the upper surface of the chuck table 36. Thereafter, the suction means (not shown) is operated to hold the wafer 10 through the dicing tape T on the chuck table 36 under suction (wafer holding step). Accordingly, the wafer 10 is held on the chuck table 36 in the condition where the front side 10*a* of the wafer 10 is oriented upward. Further, the annular frame F is fixed by the clamps 362.

Thereafter, the feeding means 37 is operated to move the chuck table 36 holding the wafer 10 under suction to a position directly below the imaging means 6. In the condition where the chuck table 36 is positioned directly below the imaging means 6, the control means 8 operates the imaging means 6 to perform an alignment operation for detecting a subject area of the wafer 10 to be laser-processed. More specifically, the imaging means 6 and the control means 8 perform image processing such as pattern matching for making the alignment of the streets 101 extending in a first direction on the wafer 10 and the focusing means 524 of the laser beam applying means 52 for applying the laser beam along the streets 101, thus performing the alignment of a laser beam applying position. The imaging means 6 and the control means 8 similarly perform the alignment operation for the other streets 101 extending in a second direction perpendicular to the first direction mentioned above on the wafer 10.

Figure 6A:
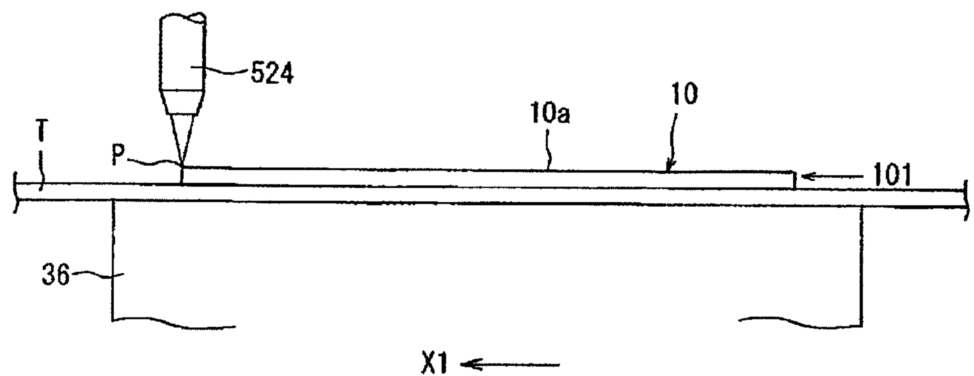
FIGS. 6A to 6C are views for illustrating a laser processed groove forming step in the laser processing method according to the present invention.

After detecting all of the streets 101 formed on the wafer 10 held on the chuck table 36 and performing the alignment operation, the chuck table 36 is moved to a position where one end (left end as viewed in FIG. 6A) of a predetermined one of the streets 101 extending in the first direction is positioned directly below the focusing means 524 as shown in FIG. 6A. Thereafter, the focal point P of the pulsed laser beam to be applied through the focusing means 524 is set near the front side 10*a* (upper surface) of the wafer 10.

Figure 6B:
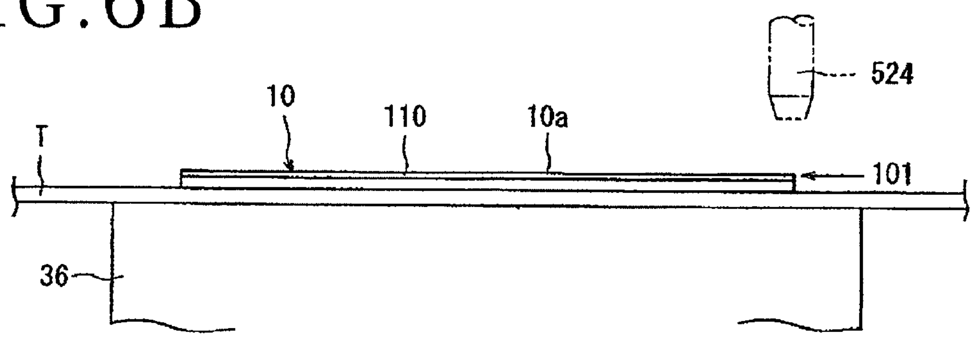
Figure 6C:
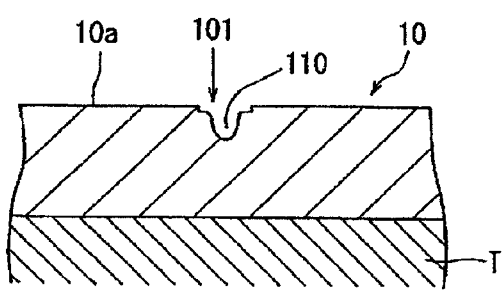

Thereafter, the laser beam applying means 52 is operated to apply the pulsed laser beam through the focusing means 524 to the wafer 10, and the chuck table 36 is moved in the direction shown by an arrow X1 in FIG. 6A at a predetermined feed speed. The repetition frequency, wavelength, and pulse width of the pulsed laser beam LB to be oscillated by the pulsed laser beam oscillating means 522 of the laser beam applying means 52 are set according to the material of the wafer 10 in a manner to be hereinafter described, and are input from the input means 80. The power of the pulsed laser beam LB is also input from the input means 80. Accordingly, the control means 8 controls the pulsed laser oscillator 522*a*, the wavelength adjusting means 522*b*, the repetition frequency setting means 522*c*, and the pulse width adjusting means 522*d* of the pulsed laser beam oscillating means 522 and the power adjusting means 523 according to the instructions input from the input means 80. When the other end (right end as viewed in FIG. 6B) of the predetermined street 101 reaches the position directly below the focusing means 524 as shown in FIG. 6B, the application of the pulsed laser beam is stopped and the movement of the chuck table 36 is also stopped (laser processed groove forming step). As a result, a laser processed groove 110 is formed along the predetermined street 101 on the wafer 10 as shown in FIGS. 6B and 6C.

After performing the laser processed groove forming step along all of the streets 101 extending in the first direction on the wafer 10, the chuck table 36 is rotated 90° to similarly perform the laser processed groove forming step along all of the other streets 101 extending in the second direction perpendicular to the first direction.

The pulsed laser beam to be applied in the laser processed groove forming step will now be described. The present inventor examined by experiment the relation between the wavelength and pulse width of the pulsed laser beam to be applied in the case of using sapphire ($Al_2O_3$), lithium tantalate (LT), silicon carbide (SiC), and silicon (Si) as the material of the workpiece. In the experiment conducted by the present inventor, it was found that no cracks were generated when the repetition frequency of the pulsed laser beam was set to 20 kHz, the pulse width was set to 10 ps or less, and the wavelength was set to the absorption edge of the material of the workpiece (sapphire ($Al_2O_3$): 155 nm, lithium tantalate (LT): 246 nm, silicon carbide (SiC): 433 nm, silicon (Si): 1033 nm). Further, it was also found that no cracks were generated even when the repetition frequency was set to 50 kHz with the pulse width kept at 10 ps or less. Based on these findings, the present inventor conducted an experiment in the following manner.

(1) The repetition frequency was set to 50 kHz and the pulse width was set to 10 ns. Further, the wavelength of the pulsed laser beam was set near the absorption edge of the material of the workpiece (sapphire ($Al_2O_3$): 155 nm, lithium tantalate (LT): 246 nm, silicon carbide (SiC): 433 nm, silicon (Si): 1033 nm). Under these conditions, the power capable of ablating the workpiece without cracks was determined.

(2) The wavelength of the pulsed laser beam was changed to 9/10, 8/10, 7/10, and 6/10 of the absorption edge of each of the above-mentioned four kinds of materials ($Al_2O_3$, LT, SiC, and Si), and the pulse width was changed to 100 ps, 1 ns, 10 ns, and 100 ns. Under these conditions, the limit of the pulse width was determined for the ablation without cracks.

(3) Further, the wavelength of the pulsed laser beam was changed to values two times and four times the absorption edge of each of the above-mentioned four kinds of materials, and the pulse width was changed to 100 fs and 10 fs. Under these conditions, the limit of the pulse width was determined for the ablation without cracks.

Figure 7:
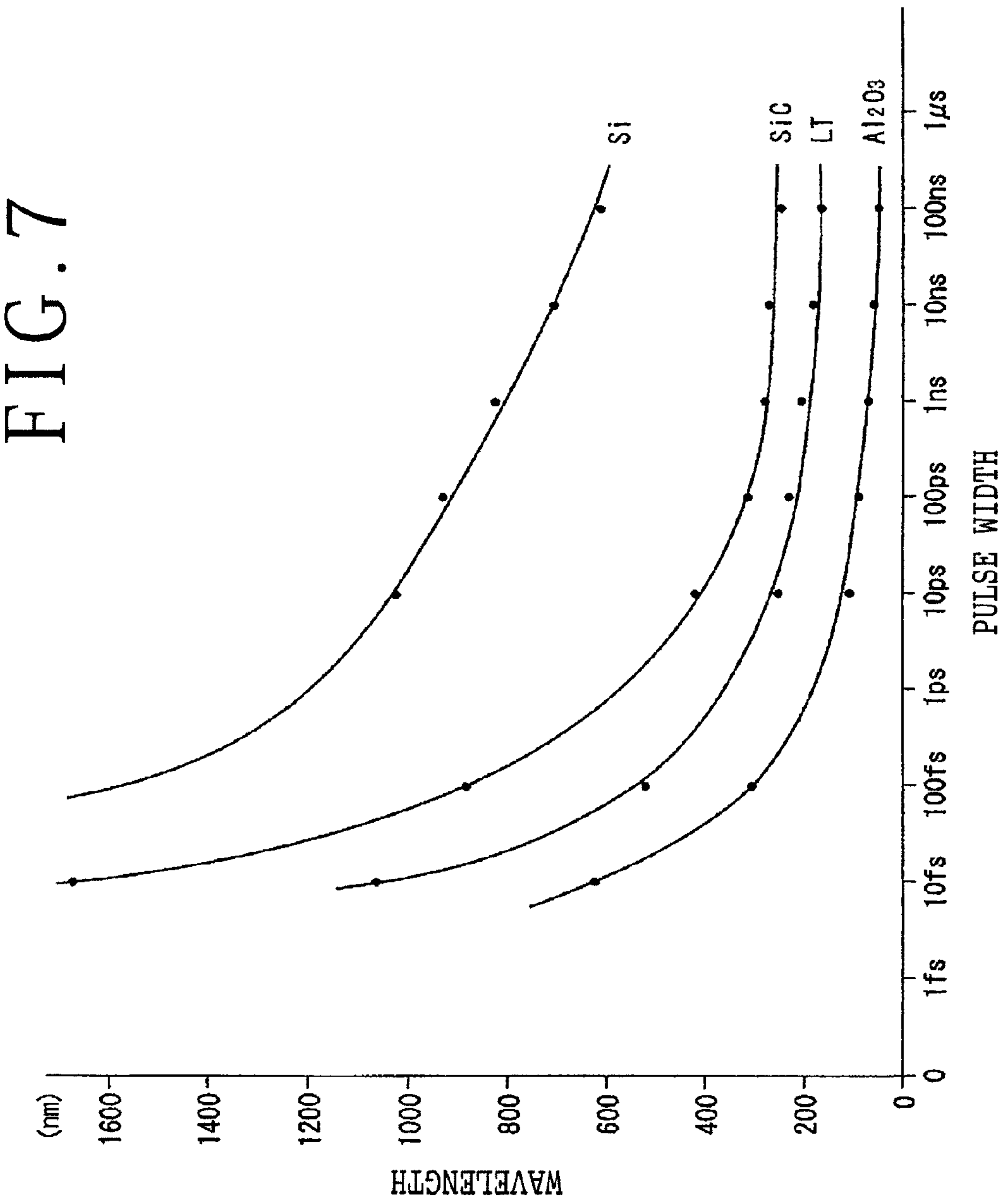
FIG. 7 is a graph showing the relation between the wavelength and pulse width of a pulsed laser beam to be applied to various substrates of sapphire ($Al_2O_3$), lithium tantalate (LT), silicon carbide (SiC), and silicon (Si).

FIG. 7 is a graph showing curves obtained by connecting the limits of the pulse width at the various set values for the wavelength on each of the four kinds of materials, i.e., sapphire ($Al_2O_3$), lithium tantalate (LT), silicon carbide (SiC), and silicon (Si) as determined above by the experiment. In FIG. 7, the vertical axis represents the wavelength of the pulsed laser beam, and the horizontal axis represents the pulse width of the pulsed laser beam. As apparent from the graph shown in FIG. 7, there is a specific relation between the wavelength and pulse width of the pulsed laser beam irrespective of the kind of the material of the workpiece. In the graph shown in FIG. 7, the wavelength of the pulsed laser beam to be applied is changed to shorter wavelengths and longer wavelengths with respect to the absorption edge of each material, and the pulse width is changed stepwise. In performing laser processing under these conditions, it was found that by applying the pulsed laser beam set in the region below the curve connecting the limits of the pulse width on each material, the workpiece can be ablated without cracks in the case that the repetition frequency was set to 50 kHz. Accordingly, even when the repetition frequency is set to the range from 20 kHz to 50 kHz, the accumulation of heat can be suppressed to thereby prevent the generation of cracks in laser processing, so that the workpiece can be ablated with high processing efficiency. Further, even when the workpiece is formed of a material having a relatively short absorption edge of 155 nm, such as sapphire, it was found that the ablation can be performed without cracks by using a laser beam having a wavelength longer than the absorption edge.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method of applying a pulsed laser beam having a repetition frequency of 20 kHz or more to a workpiece to thereby process said workpiece, said laser processing method comprising the steps of:

setting the pulse width of said pulsed laser beam to 10 ps or less in the case that the wavelength of said pulsed laser beam is equal to the absorption edge of said workpiece;

setting the pulse width of said pulsed laser beam to 100 ps or less in the case that the wavelength of said pulsed laser beam is equal to 9/10 of the absorption edge of said workpiece;

setting the pulse width of said pulsed laser beam to 1 ns or less in the case that the wavelength of said pulsed laser beam is equal to 8/10 of the absorption edge of said workpiece;

setting the pulse width of said pulsed laser beam to 10 ns or less in the case that the wavelength of said pulsed laser beam is equal to 7/10 of the absorption edge of said workpiece;

setting the pulse width of said pulsed laser beam to 100 ns or less in the case that the wavelength of said pulsed laser beam is equal to 6/10 of the absorption edge of said workpiece;

setting the pulse width of said pulsed laser beam to 100 fs or less in the case that the wavelength of said pulsed laser beam is equal to a value two times the absorption edge of said workpiece; and setting the pulse width of said pulsed laser beam to 10 fs or less in the case that the wavelength of said pulsed laser beam is equal to a value four times the absorption edge of said workpiece;

wherein the relation between the various set values for the wavelength of said pulsed laser beam and the various set values for the pulse width of said pulsed laser beam is plotted to prepare a graph having a vertical axis representing the wavelength and a horizontal axis representing the pulse width, and said pulsed laser beam is applied in the region below a curve obtained by connecting the limits of the pulse width at the various set values for the wavelength.

* * * * *